United States Patent [19]
Kawano et al.

[11] Patent Number: 5,644,586
[45] Date of Patent: Jul. 1, 1997

[54] SEMICONDUCTOR LASER DEVICE AND METHOD OF FABRICATING SEMICONDUCTOR LASER DEVICE

[75] Inventors: Minoru Kawano; Go Sakaino, both of Itami, Japan

[73] Assignee: Mitsubishi Denki Kabushiki Kaisha, Tokyo, Japan

[21] Appl. No.: 526,561

[22] Filed: Sep. 12, 1995

[30] Foreign Application Priority Data

Sep. 16, 1994 [JP] Japan .................................. 6-221679

[51] Int. Cl.$^6$ .................................................. H01S 3/18
[52] U.S. Cl. .............................. 372/44; 372/50; 257/88
[58] Field of Search ............................ 372/43, 44, 50; 257/88, 96

[56] References Cited

FOREIGN PATENT DOCUMENTS

| 58-142588 | 8/1983 | Japan | 372/43 |
| 62-140484 | 6/1987 | Japan | 372/43 |
| 6-283807 | 10/1994 | Japan | 372/43 |

OTHER PUBLICATIONS

Jackson et al, "Flip–Chip, Self–Aligned Optoelectronic Transceiver Module", 18th European Conference on Optical Communication, 1992, pp. 329–332 (no month available).

Primary Examiner—Rodney B. Bovernick
Assistant Examiner—Yisun Song
Attorney, Agent, or Firm—Leydig, Voit & Mayer

[57] ABSTRACT

In a semiconductor laser device including a stack of semiconductor laser chips, each semiconductor laser chip includes opposite upper and lower surfaces, an upper electrode disposed on a portion of the upper surface, and a lower electrode disposed on a portion of the lower surface. Two adjacent semiconductor laser chips in the stack are connected such that the lower electrode of an upper laser chip is bonded to the upper electrode of a lower laser chip with solder. Since the upper electrode (lower electrode) is disposed on a portion of the upper surface (lower surface) of each laser chip, i.e., it is not disposed over the entire upper surface (lower surface) of the laser chip, the solder hardly flows over the side surface of the laser chip, so that unwanted short-circuiting between the upper electrode and the lower electrode of the laser chip is avoided. In addition, when solder is molten between two electrodes, the molten solder spreads over the surfaces of the electrodes, and the surface tension of the molten solder draws the electrodes to each other so that the electrodes are automatically aligned with each other. Therefore, in this stacked laser device, since the surface tension of the molten solder functions between the upper electrode and the lower electrode of the adjacent laser chips, automatic alignment is performed between these laser chips.

3 Claims, 14 Drawing Sheets

SEMICONDUCTOR LASER DEVICE AND METHOD OF FABRICATING SEMICONDUCTOR LASER DEVICE

FIELD OF THE INVENTION

The present invention relates to semiconductor laser devices and, more particularly, to a semiconductor laser device comprising a stack of semiconductor laser chips (hereinafter referred to as a stacked semiconductor laser device) that is used as a high-power output semiconductor laser device. The invention also relates to methods for fabricating the stacked semiconductor laser device.

BACKGROUND OF THE INVENTION

In order to increase output power of a semiconductor laser device, a plurality of unit semiconductor laser chips are stacked one on another to make a stacked semiconductor laser device.

FIG. 14 is a front view illustrating a prior art stacked semiconductor laser device. In the figure, reference numeral 5 designates a heat sink. A first unit semiconductor laser chip 1 is bonded to the heat sink 5 with solder 7. Likewise, second, third, and fourth unit semiconductor laser chips 2, 3, and 4 are successively stacked one on another on the first unit semiconductor laser chip 1. Each semiconductor laser chip includes an active layer 6, an upper electrode 9, and a lower electrode 10. A wire 8 is bonded to the upper electrode 9 of the fourth unit semiconductor laser chip 4. Hereinafter, for simplification, the stacked semiconductor laser device is referred to as a stacked laser device and a unit semiconductor laser chip is referred to as a laser chip.

A method of fabricating the prior art stacked laser device will be described.

Initially, the solder 7 is applied to the heat sink 5, and the first laser chip 1 is put on the heat sink 5 so that the lower electrode 10 contacts the solder 7, followed by heating to the solder 7 adheres to the heat sink 5 to the lower electrode 10 of the first laser chip 1. Thereafter, the solder 7 is applied to the upper electrode 9 of the first laser chip 1 and the second laser chip 2 is put on the first laser chip 1 so that the lower electrode 10 of the second laser chip 2 contacts the solder 7 on the first laser chip, followed by heating so the solder 7 adheres to the upper electrode 9 of the first laser chip 1 to the lower electrode 10 of the second laser chip 2. The above-described process is repeated with respect to the remaining third and fourth laser chips 3 and 4, thereby completing the structure shown in FIG. 14 in which the first to fourth laser chips 1 to 4 are stacked on one another through the solder 7. Finally, the wire 8 is bonded to the upper electrode 9 of the fourth laser chip 4 to complete the stacked laser device.

The prior art stacked laser device has the following drawbacks.

First, when the laser chips are stacked one on another, the solder 7 unfavorably flows over the side surface of, for example, the first laser chip 1 as shown in FIG. 14, resulting in short-circuiting between the upper electrode 9 and the lower electrode 10 of the first laser chip. Second, when the solder 7 between two adjacent laser chips, for example, the second and third laser chips 2 and 3, is molten to adhere the upper and lower electrodes of these laser chips, the solder 7 between the first and second laser chips 1 and 2 is also molten and these laser chips 1 and 2 are unfavorably moved. As a result, the precision in aligning the laser chips is degraded.

SUMMARY OF THE INVENTION

An object of the present invention is to provide a stacked semiconductor laser device that prevents short-circuiting between upper and lower electrodes of each laser chip caused by solder flowing over the side surface of the laser chip and that provides high precision in aligning laser chips.

Another object of the present invention is to provide a relatively simple method of fabricating a stacked semiconductor laser device.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, in a semiconductor laser device comprising a stack of semiconductor laser chips, each semiconductor laser chip includes opposite upper and lower surfaces, an upper electrode disposed on a portion of the upper surface, and a lower electrode disposed on a portion of the lower surface, and adjacent two semiconductor laser chips in the stack are connected such that the lower electrode of an upper laser chip is bonded to the upper electrode of a lower laser chip with solder. Since the upper electrode (lower electrode) is disposed on a portion of the upper surface (lower surface) of each laser chip, in other words, since it is not disposed over the upper surface (lower surface) of the laser chip, there is little possibility that the solder overflowing the upper electrode (lower electrode) region reaches the edges of the upper surface (lower surface). Therefore, the solder hardly reaches the side surface of the laser chip, so that unwanted short-circuiting between the upper electrode and the lower electrode of the laser chip is avoided. In addition, when solder is molten between two electrodes, the molten solder spreads over the surfaces of the electrodes, and the surface tension of the molten solder draws the electrodes to each other so that the electrodes are automatically aligned with each other. Therefore, in this stacked laser device, since the surface tension of the molten solder functions between the upper electrode and the lower electrode of the adjacent laser chips, automatic alignment is performed between these laser chips. As a result, a stacked laser device in which a plurality of laser chips are aligned with high accuracy is realized.

According to a second aspect of the present invention, in the above-described stacked laser device, each semiconductor laser chip has a recess on the lower surface, and the lower electrode is disposed in the recess. In this structure, the molten solder remains within the recess and does not overflow the recess. Therefore, unwanted flow of the solder toward the side surface of the laser chip is prevented, whereby short-circuiting between the upper electrode and the lower electrode of the laser chip is avoided. In addition, the above-described automatic alignment between the laser chips is performed.

According to a third aspect of the present invention, in the above-described stacked laser device, a portion of the upper surface of the semiconductor laser chip where the upper electrode is absent is covered with a film having a poorer adhesion with solder than the upper electrode, and a portion of the lower surface of the semiconductor laser chip where the lower electrode is absent is covered with a film having a poorer adhesion with solder than the lower electrode. Therefore, the solder remains within the region between the upper and lower electrodes and does not spread over the upper and lower surfaces of the laser chip. Therefore, unwanted flow of the solder toward the side surface of the laser chip is prevented, whereby short-circuiting between the upper electrode and the lower electrode of the laser chip is avoided. In addition, the above-described automatic alignment between the laser chips is performed.

According to a fourth aspect of the present invention, in the above-described stacked laser device, a groove is formed on the upper surface of the semiconductor laser chip surrounding the upper electrode. Therefore, even when the solder flows over the upper electrode, it is collected in the groove and does not spread outside the groove. Therefore, unwanted flow of the solder toward the side surface of the laser chip is prevented, whereby short-circuiting between the upper electrode and the lower electrode of the laser chip is avoided. In addition, the above-described automatic alignment between the laser chips is performed.

According to a fifth aspect of the present invention, in the above-described stacked laser device, the upper and lower electrodes of the semiconductor laser chip are cross-shaped and disposed at the same positions on the upper and lower surfaces of the laser chip, respectively. In this case, since the upper electrode (lower electrode) is disposed on a portion of the upper surface (lower surface) of each laser chip, in other words, since it is not disposed over the upper surface (lower surface) of the laser chip, there is little possibility that the solder overflowing the upper electrode (lower electrode) region reaches the edges of the upper surface (lower surface). Therefore, the solder hardly reaches the side surface of the laser chip, so that unwanted short-circuiting between the upper electrode and the lower electrode of the laser chip is avoided. Also in this structure, center positions of the laser chips are automatically aligned by the surface tension of the molten solder that is present between the electrodes of the adjacent laser chips. In addition, since the upper and lower electrodes are cross-shaped, the surface tension of the molten solder acts in the direction of rotation of the laser chips, so that the directions of the laser chips are automatically aligned. As a result, a stacked laser device in which the center positions and the directions of the laser chips are aligned with high accuracy is realized.

According to a sixth aspect of the present invention, a method of fabricating a semiconductor laser device comprises preparing a plurality of semiconductor laser chips, each having opposite upper and lower surfaces, and a heat sink having a surface; forming an upper electrode on a portion of the upper surface of each semiconductor laser chip; forming a recess in a portion of the lower surface of each semiconductor laser chip by etching; forming a lower electrode in the recess of the semiconductor laser chip; forming a solder layer on the lower electrode of each semiconductor laser chip; mounting a first semiconductor laser chip on the surface of the heat sink with the lower electrode looking downward and heating the laser chip to adhere the laser chip to the heat sink through the solder layer; and mounting a second semiconductor laser chip on the upper surface of the first laser chip on the heat sink with the lower electrode looking downward, followed by heating to adhere the second laser chip to the first laser chip through the solder layer, and repeating the mounting and the heating with respect to remaining semiconductor laser chips, thereby completing a semiconductor laser device comprising a stack of the semiconductor laser chips. In this method, since the molten solder remains within the recess and does not overflow the recess, unwanted flow of the solder toward the side surface of the laser chip is prevented, whereby short-circuiting between the upper electrode and the lower electrode of the laser chip is avoided. In addition, the above-described automatic alignment between the laser chips is performed.

According to a seventh aspect of the present invention, a method of fabricating a semiconductor laser device comprises preparing a plurality of semiconductor laser chips, each having opposite upper and lower surfaces, and a heat sink having a surface; forming an upper electrode on a portion of the upper surface of each semiconductor laser chip; forming a recess in a portion of the lower surface of each semiconductor laser chip by etching; forming a lower electrode in the recess of the semiconductor laser chip; forming a solder layer on the upper electrode of each semiconductor laser chip; applying a solder to the surface of the heat sink; mounting a first semiconductor laser chip on the surface of the heat sink with the lower electrode contacting the solder on the heat sink, and heating the first laser chip to adhere the first laser chip to the heat sink through the solder; and mounting a second semiconductor laser chip on the upper surface of the first laser chip on the heat sink with the lower electrode contacting the solder layer on the first laser chip, followed by heating to adhere the second laser chip to the first laser chip through the solder layer, and repeating the mounting and the heating with respect to remaining semiconductor laser chips, thereby completing a semiconductor laser device comprising a stack of the semiconductor laser chips. In this method, since the molten solder remains within the recess and does not overflow the recess, unwanted flow of the solder toward the side surface of the laser chip is prevented, whereby short-circuiting between the upper electrode and the lower electrode of the laser chip is avoided. In addition, the above-described automatic alignment between the laser chips is performed.

According to an eighth aspect of the present invention, a method of fabricating a semiconductor laser device comprises preparing a plurality of semiconductor laser chips, each having opposite upper and lower surfaces, and a heat sink having a surface; forming an upper electrode on a portion of the upper surface of each semiconductor laser chip; forming a film having a poorer adhesion with solder than the upper electrode on a portion of the upper surface of each semiconductor laser chip where the upper electrode is absent; forming a lower electrode on a portion of the lower surface of each semiconductor laser chip; forming a film having a poorer adhesion with solder than the lower electrode on a portion of the lower surface of each semiconductor laser chip where the lower electrode is absent; forming a solder layer on the lower electrode of each semiconductor laser chip; mounting a first semiconductor laser chip on the surface of the heat sink with the lower electrode looking downward and heating the laser chip to adhere the laser chip to the heat sink through the solder layer; and mounting a second semiconductor laser chip on the upper surface of the first laser chip on the heat sink with the lower electrode looking downward, followed by heating to adhere the second laser chip to the first laser chip through the solder layer, and repeating the mounting and the heating with respect to remaining semiconductor laser chips, thereby completing a semiconductor laser device comprising a stack of the semiconductor laser chips. Therefore, the solder remains within the region between the upper and lower electrodes and does not spread over the upper and lower surfaces of the laser chip. As a result, unwanted flow of the solder toward the side surface of the laser chip is prevented, whereby short-circuiting between the upper electrode and the lower electrode of the laser chip is avoided. In addition, the above-described automatic alignment between the laser chips is performed.

According to a ninth aspect of the present invention, a method of fabricating a semiconductor laser device comprises preparing a plurality of semiconductor laser chips, each having opposite upper and lower surfaces, and a heat sink having a surface; forming an upper electrode on a portion of the upper surface of each semiconductor laser chip; forming a groove on the upper surface of each semiconductor laser chip surrounding the upper electrode by etching; forming a lower electrode on a portion of the lower surface of each semiconductor laser chip; forming a solder layer on the upper electrode of each semiconductor laser chip; applying a solder to the surface of the heat sink; mounting a first semiconductor laser chip on the surface of the heat sink with the lower electrode contacting the solder on the heat sink, and heating the first laser chip to adhere the first laser chip to the heat sink through the solder; and mounting a second semiconductor laser chip on the upper surface of the first laser chip on the heat sink with the lower electrode contacting the solder layer on the first laser chip, followed by heating to adhere the second laser chip to the first laser chip through the solder layer, and repeating the mounting and the heating with respect to remaining semiconductor laser chips, thereby completing a semiconductor laser device comprising a stack of the semiconductor laser chips. Therefore, even when the solder flows over the upper electrode, it is collected in the groove and does not spread outside the groove. Therefore, unwanted flow of the solder toward the side surface of the laser chip is prevented, whereby short-circuiting between the upper electrode and the lower electrode of the laser chip is avoided. In addition, the above-described automatic alignment between the laser chips is performed.

According to a tenth aspect of the present invention, a method of fabricating a semiconductor laser device comprises preparing a plurality of semiconductor laser chips, each having opposite upper and lower surfaces, and a heat sink having a surface; forming a cross-shaped upper electrode on a portion of the upper surface of each semiconductor laser chip, and forming a cross-shaped lower electrode on the lower surface of each semiconductor laser chip opposite the upper electrode; forming a solder layer on the lower electrode of each semiconductor laser chip; mounting a first semiconductor laser chip on the surface of the heat sink with the lower electrode looking downward and heating the laser chip to adhere the laser chip to the heat sink through the solder layer; and mounting a second semiconductor laser chip on the upper surface of the first laser chip on the heat sink with the lower electrode looking downward, followed by heating to adhere the second laser chip to the first laser chip through the solder layer, and repeating the mounting and the heating with respect to remaining semiconductor laser chips, thereby completing a semiconductor laser device comprising a stack of the semiconductor laser chips. In this method, since the upper electrode (lower electrode) is not disposed over the upper surface (lower surface) of the laser chip, there is little possibility that the solder overflowing the upper electrode (lower electrode) region reaches the edges of the upper surface (lower surface). Therefore, the solder hardly reaches the side surface of the laser chip, so that unwanted short-circuiting between the upper electrode and the lower electrode of the laser chip is avoided. Also in this structure, center positions of the laser chips are automatically aligned by the surface tension of the molten solder that is present between the electrodes of the adjacent laser chips. In addition, since the upper and lower electrodes are cross-shaped, the surface tension of the molten solder acts in the direction of rotation of the laser chips, so that the directions of the laser chips are automatically aligned. As a result, a stacked laser device in which the center positions and the directions of the laser chips are aligned with high accuracy is realized.

According to an eleventh aspect of the present invention, a method of fabricating a semiconductor laser device comprises preparing a plurality of semiconductor laser chips, each having opposite upper and lower surfaces, and a heat sink having a surface; forming a cross-shaped upper electrode on a portion of the upper surface of each semiconductor laser chip, and forming a cross-shaped lower electrode on the lower surface of each semiconductor laser chip opposite the upper electrode; forming a solder layer on the upper electrode of each semiconductor laser chip; applying a solder to the surface of the heat sink; mounting the first semiconductor laser chip on the surface of the heat sink with the lower electrode contacting the solder on the heat sink, and heating the first laser chip to adhere the first laser chip to the heat sink through the solder; and mounting the second semiconductor laser chip on the upper surface of the first laser chip on the heat sink with the lower electrode contacting the solder layer on the first laser chip, followed by heating to adhere the second laser chip to the first laser chip through the solder layer, and repeating the mounting and the heating with respect to remaining semiconductor laser chips, thereby completing a semiconductor laser device comprising a stack of the semiconductor laser chips. Also in this method, since the solder hardly reaches the side surface of the laser chip, unwanted short-circuiting between the upper electrode and the lower electrode of the laser chip is avoided. In addition, the center positions and the directions of the laser chips are aligned with high accuracy.

DETAILED DESCRIPTION OF THE PREFERRED EMBODIMENTS

Embodiment 1.

Figure 1:
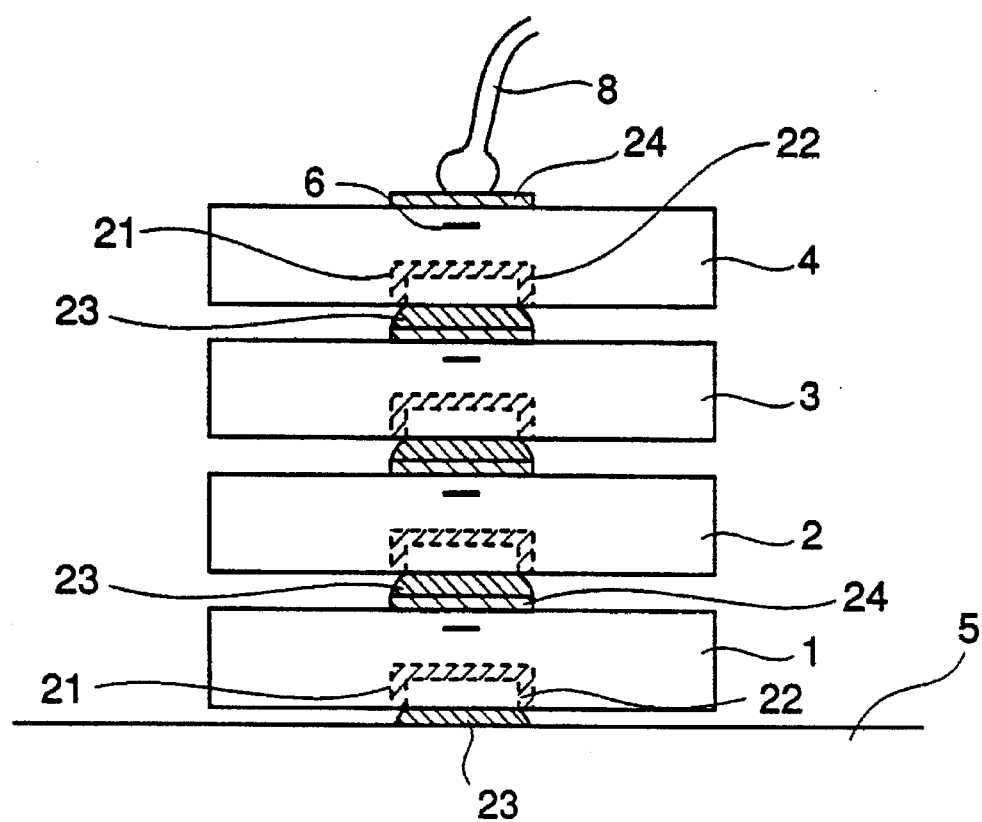
FIG. 1 is a front view of a stacked semiconductor laser device in accordance with a first embodiment of the present invention.

FIG. 1 is a front view of a stacked semiconductor laser according to a first embodiment of the present invention. In FIG. 1, reference numeral 5 designates a heat sink. First to fourth unit semiconductor laser chips 1 to 4 are successively stacked on the heat sink 5. Each laser chip includes an active layer 6, a recess 21 formed on the lower surface by etching, a lower electrode 22 located in the recess 21, and an upper electrode 24 disposed on the upper surface. The heat sink 5 and the laser chips 1 to 4 are connected through solder layers 23. Preferably, AuSn is used as the solder layers 23. A wire 8 is bonded to the upper electrode 24 of the fourth laser chip 4.

Figure 2:
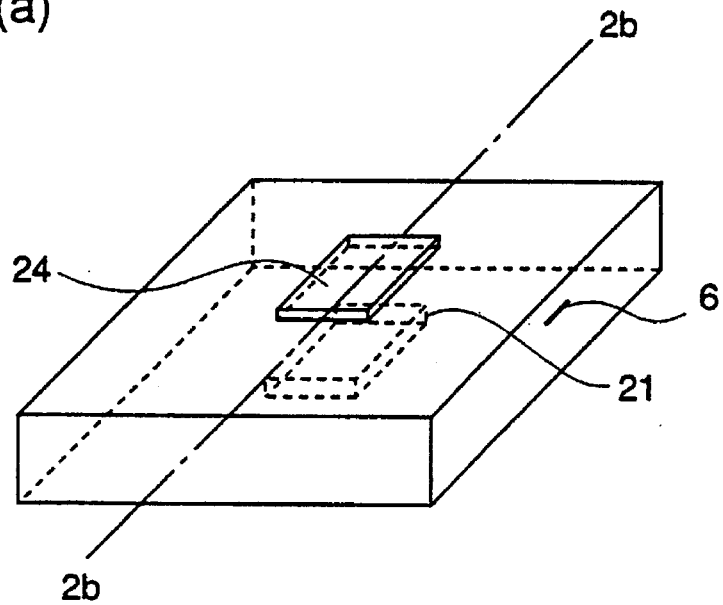
FIG. 2(a) is a perspective view of a unit semiconductor laser chip before assembly of the stacked semiconductor laser device according to the first embodiment of the invention.
FIG. 2(b) is a cross-sectional view of the laser chip taken along a line 2b—2b in FIG. 2(a)
FIG. 2(c) is a plan view of the laser chip.
Figure 2:
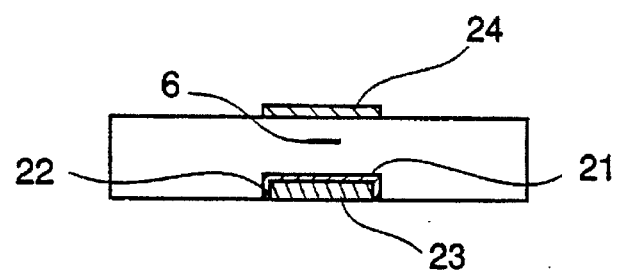
Figure 2:
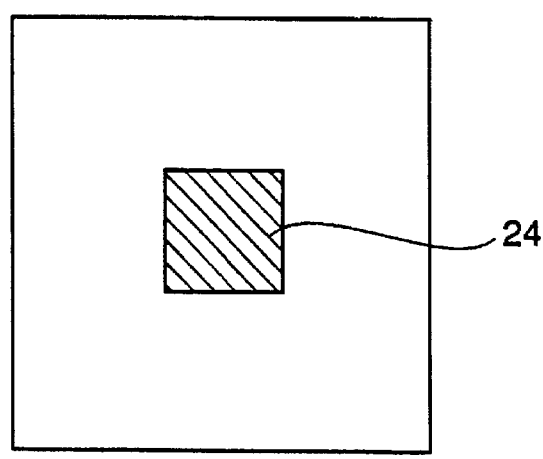
Figure 3:
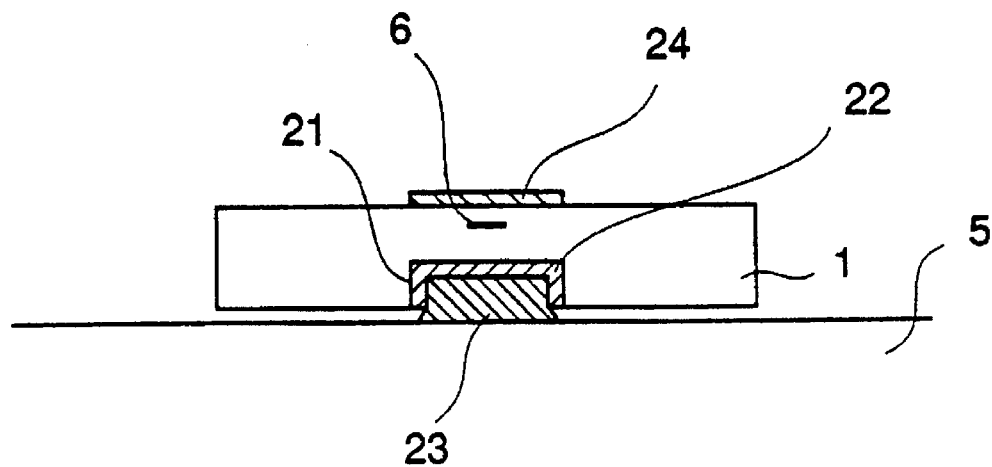
FIGS. 3(a) and 3(b) are cross-sectional views illustrating process steps in a method of fabricating the stacked semiconductor laser device according to the first embodiment of the invention.
Figure 3:
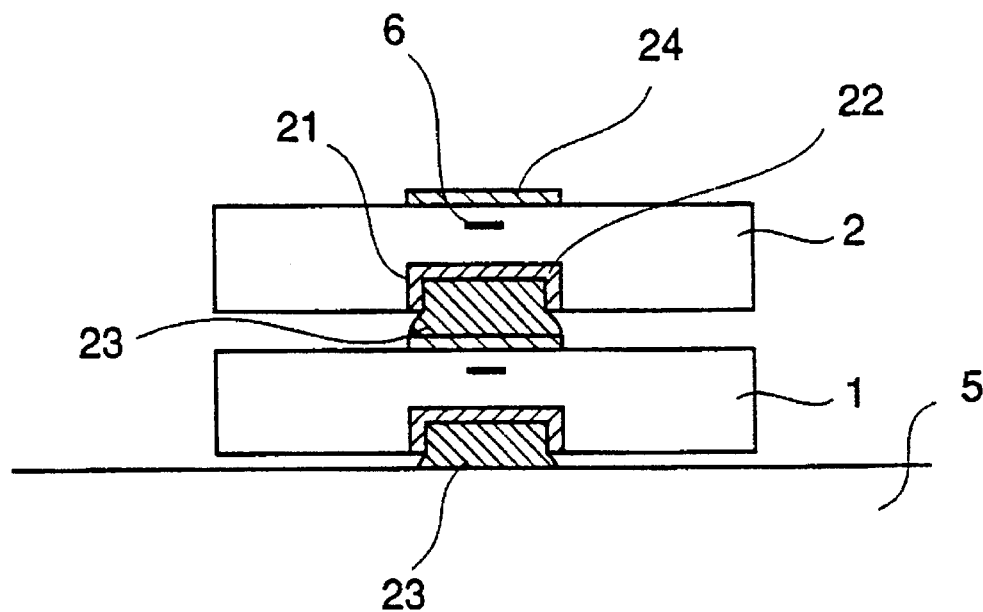

A description is given of a method for fabricating the stacked laser device shown in FIG. 1. FIG. 2(a) is a perspective view of a laser chip before assembly of the stacked laser device, FIG. 2(b) is a cross-sectional view of the laser chip taken along a line 2b—2b in FIG. 2(a), and FIG. 2(c) is a top plan view of the laser chip. FIGS. 3(a) and 3(b) are cross-sectional views for explaining assembly of the stacked laser device.

Initially, the upper electrode 24 is produced on the upper surface of the laser chip, and the recess 21 is produced on the lower surface of the laser chip by etching. The size of the recess 21 is about 10 μm both in length and width and about 2 μm in depth. Thereafter, the lower electrode 22 is produced on the inner surface of the recess 21, and the AuSn solder layer 23 about 2 μm thick is formed in the recess 21 by vacuum evaporation, completing the laser chip shown in FIGS. 2(a)-2(c).

In the step of FIG. 3(a), the first laser chip 1 is put on the heat sink 5 with the lower electrode 22 facing downward. Then, the laser chip 1 is heated to a temperature of about 340° C. until the solder layer 23 is molten, whereby the solder layer 23 adheres the lower electrode 22 to the heat sink 5. Thereafter, as illustrated in FIG. 3(b), the second laser chip 2 is put on the first laser chip 1 so that the solder layer 23 on the lower electrode 22 of the second laser chip 2 is positioned on the upper electrode 24 of the first laser chip 1, and the second laser chip 2 is heated until the solder layer 23 is molten, whereby the solder layer 23 of the second laser chip 2 adheres the lower electrode 22 of the second laser chip 2 to the upper electrode 24 of the first laser chip 1. The same process step as shown in FIG. 3(b) is carried out with respect to the third laser chip 3 and the fourth laser chip 4. Finally, the wire 8 is bonded to the upper electrode 24 of the fourth laser chip 4 to complete the stacked laser device shown in FIG. 1.

In this first embodiment of the invention, the molten solder remains within the recess 21 and does not overflow from the recess. Therefore, unwanted flow of the solder toward the side surface of a laser chip is prevented, whereby short-circuiting between the upper electrode and the lower electrode of a laser chip is avoided.

Figure 4:
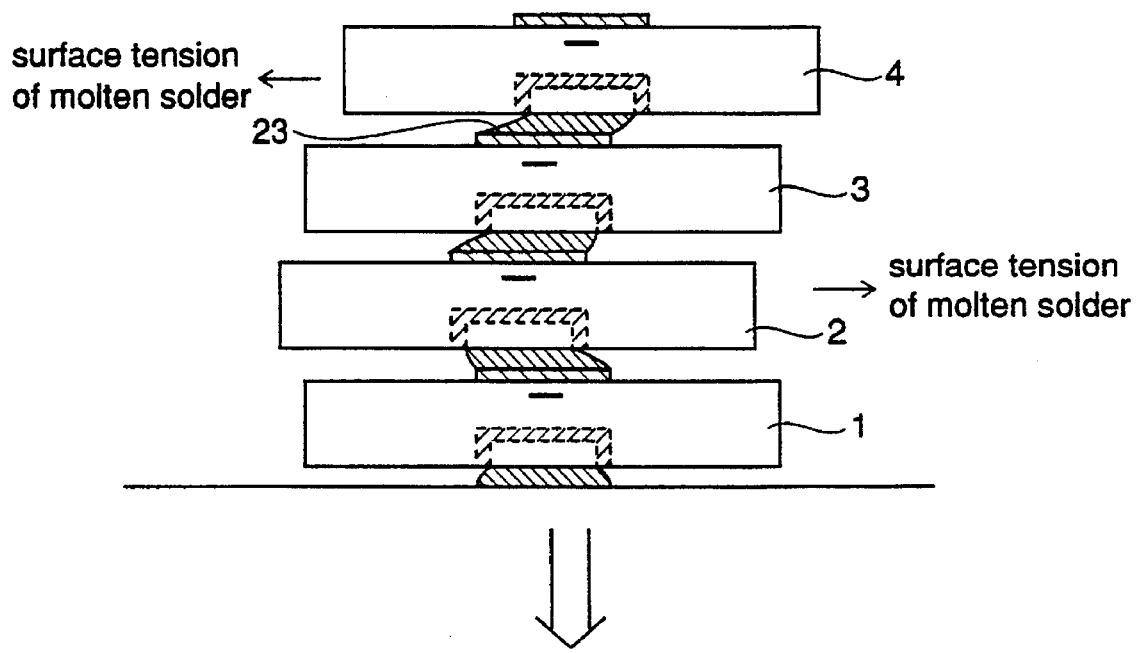
FIGS. 4(a) and 4(b) are front views for explaining automatic alignment of laser chips utilizing surface tension of molten solder between electrodes.
Figure 4:
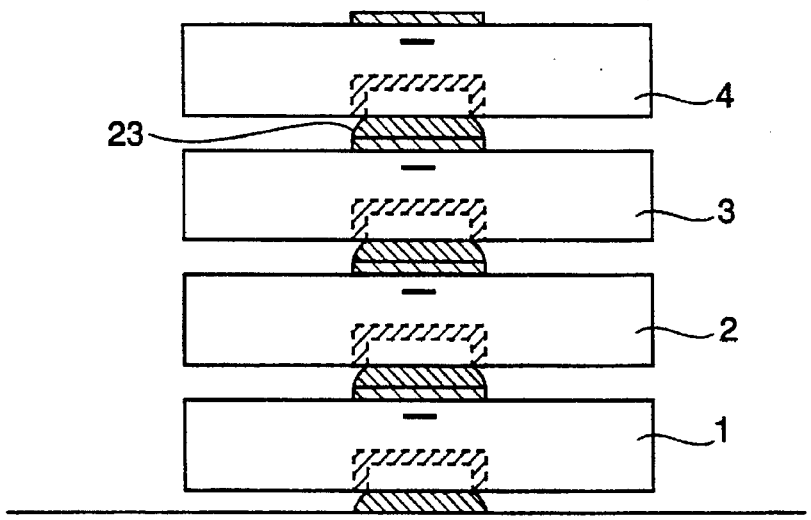

Meanwhile, as described by K. P. Jackson et al. in "Flip-Chip, Self-Aligned, Optoelectronic Transceiver Module", Technical Digest of ECOC, '92, p. 329, when solder is molten between two electrodes, the molten solder spreads over the surfaces of the electrodes, and the surface tension of the molten solder draws the electrodes to each other so that the electrodes are automatically aligned with each other. Therefore, in the stacked laser device according to this first embodiment of the invention, since the surface tension of the molten solder functions between the upper electrode and the lower electrode of adjacent laser chips, the state shown in FIG. 4(b) is more stable than the state shown in FIG. 4(a). Thus, automatic alignment is performed between these laser chips. As a result, a stacked laser device in which a plurality of laser chips are aligned with high accuracy is realized.

Embodiment 2.

Figure 5:
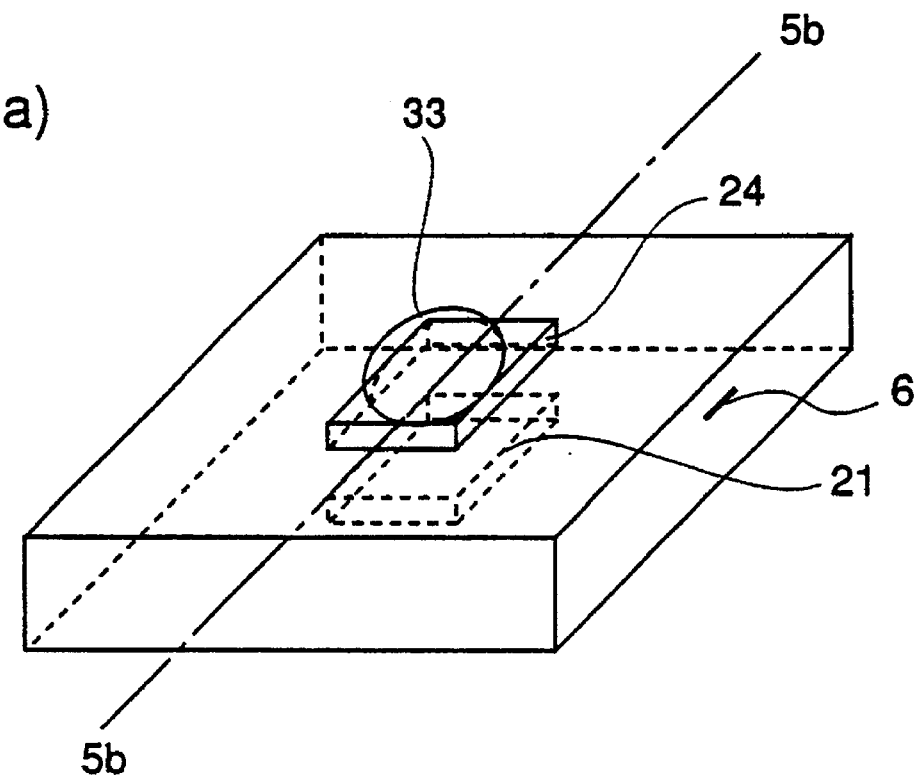
FIG. 5(a) is a perspective view of a unit semiconductor laser chip before assembly of a stacked semiconductor laser device according to a second embodiment of the present invention.
FIG. 5(b) is a cross-sectional view of the laser chip taken along a line 5b—5b in FIG. 5(a).
Figure 5:
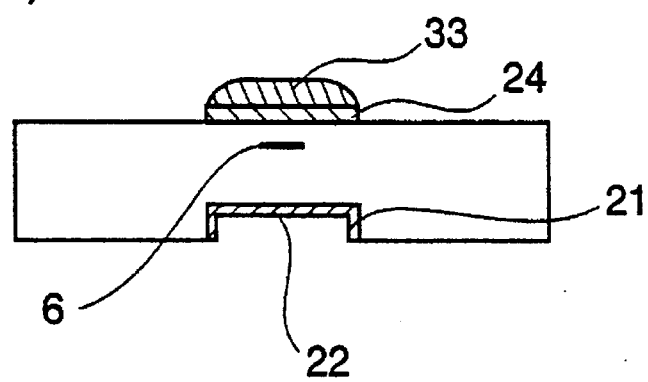
Figure 6:
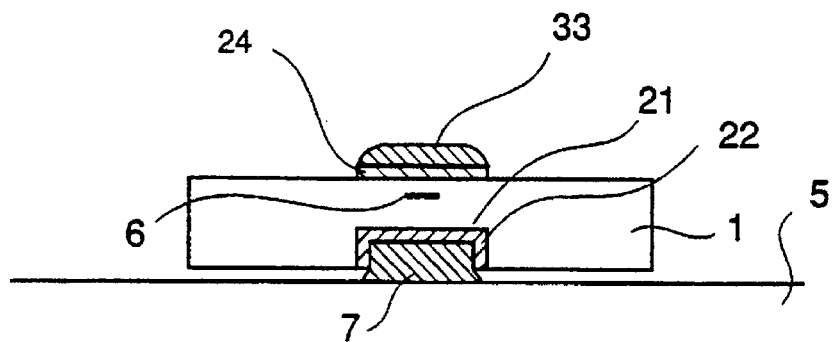
FIGS. 6(a)–6(c) are cross-sectional views illustrating process steps in a method of fabricating the stacked semiconductor laser device according to the second embodiment of the invention.
Figure 6:
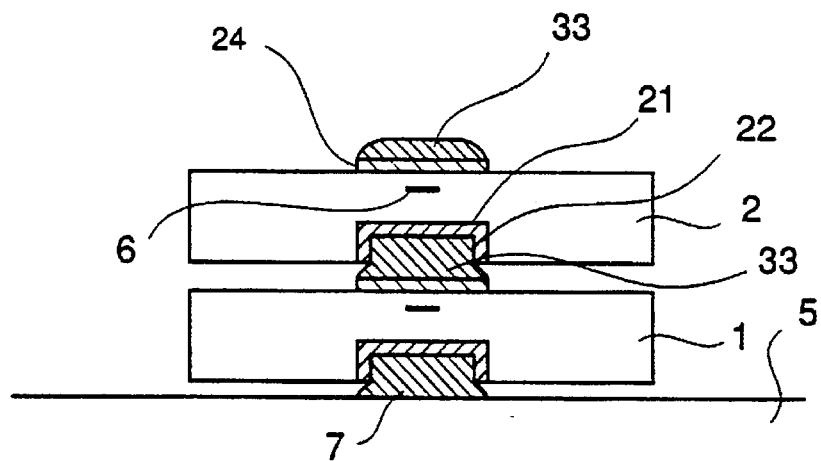
Figure 6:
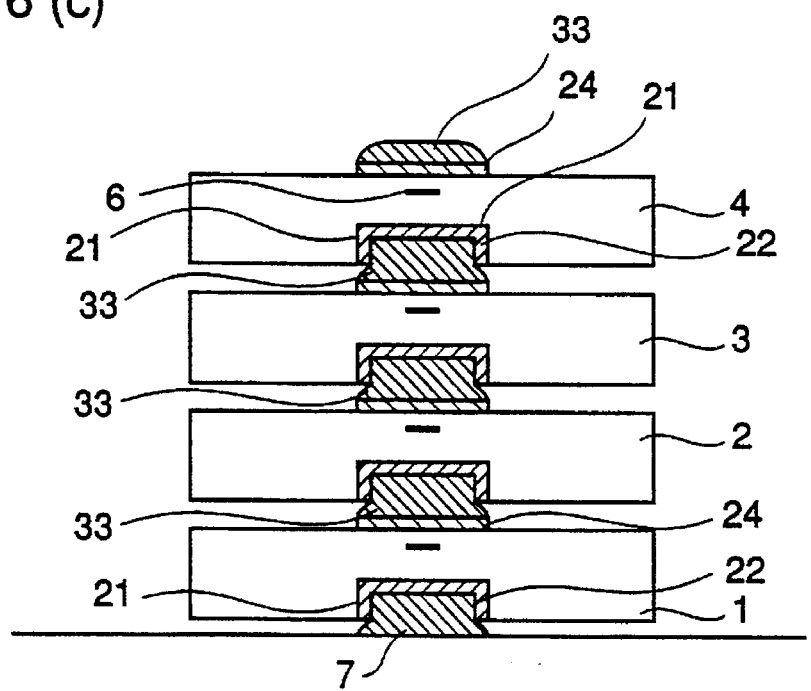

A description is given of a stacked laser device according to a second embodiment of the invention. FIG. 5(a) is a perspective view illustrating a laser chip before assembly of a stacked laser device according to this second embodiment of the invention, and FIG. 5(b) is a cross-sectional view of the laser chip taken along a line 5b—5b in FIG. 5(a). FIGS. 6(a)-6(c) are cross-sectional views for explaining assembly of the stacked laser device. In these figures, the same reference numerals as those shown in FIGS. 2(a)-2(c) and 3(a)-3(b) designate the same or corresponding parts. Reference numeral 7 designates solder, and reference numeral 33 designates an AuSn solder bump.

Initially, the upper electrode 24 is produced on the upper surface of the laser chip, and the recess 21 is produced on the lower surface of the laser chip by etching. The size of the recess 21 is about 10 μm both in length and width and about 2 μm in depth. Thereafter, the lower electrode 22 is produced on the inner surface of the recess 21, and the AuSn solder bump 33 about 10 μm thick is placed on the upper electrode 24, thereby completing the laser chip shown in FIGS. 5(a)-5(b).

In the step of FIG. 6(a), solder 7 is applied to the heat sink 5, and the first laser chip 1 is put on the heat sink 5 with the lower electrode 22 facing downward so that the lower electrode 22 is positioned on the solder 7. Thereafter, the first laser chip 1 is heated to a temperature of about 340° C. until the solder 7 is molten, whereby the solder 7 adheres the lower electrode 22 of the first laser chip 1 to the heat sink 5. As illustrated in FIG. 3(b), the second laser chip 2 is put on the first laser chip 1 so that the lower electrode 22 of the second laser chip 2 is positioned on the solder bump 33 of the first laser chip 1, followed by heating to melt the solder bump 33, whereby the solder bump 33 adheres the lower electrode 22 of the second laser chip 2 to the upper electrode 24 of the first laser chip 1. The process step of FIG. 6(b) is repeated with respect to the third laser chip 3 and the fourth laser chip 4, whereby the first to fourth laser chips 1 to 4 are stacked as shown in FIG. 6(c). Finally, a wire (not shown)

is bonded to the upper electrode 24 of the fourth laser chip 4 to complete a stacked laser device.

Also in this second embodiment of the invention, since the molten solder is maintained within the recess 21 and does not overflow from the recess, unwanted flow of the solder toward the side surface of a laser chip is prevented, whereby short-circuiting between the upper electrode and the lower electrode of laser chip is avoided.

Furthermore, the first to fourth laser chips are automatically aligned with each other by the surface tension of the molten solder between the upper electrode and the lower electrode of adjacent laser chips. That is, a stacked laser device in which a plurality of laser chips are aligned with high accuracy is realized.

Embodiment 3.

Figure 7:
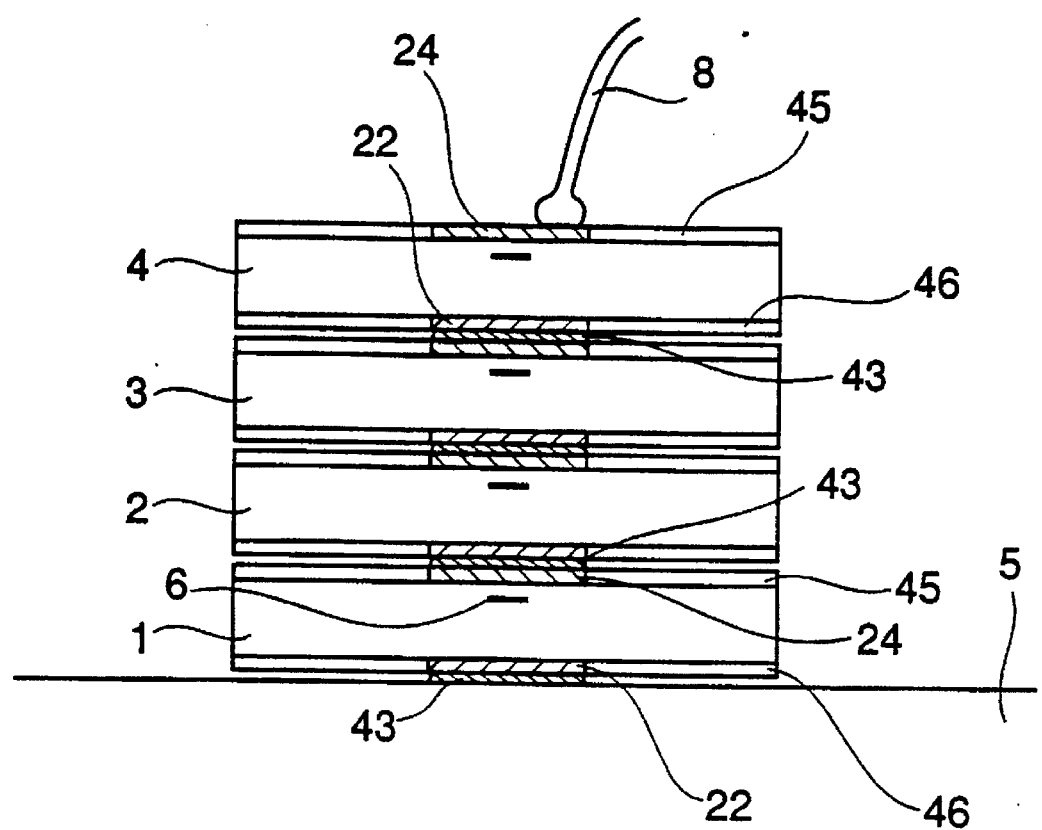
FIG. 7 is a front view of a stacked semiconductor laser device in accordance with a third embodiment of the present invention.

FIG. 7 is a front view illustrating a stacked laser device in accordance with a third embodiment of the present invention. In the figure, the same reference numerals as in FIG. 1 designate the same or corresponding parts. Reference numeral 43 designates a solder layer, such as AuSn, numeral 45 designate an upper $SiO_2$ film disposed on the upper surface of each laser chip, and numeral 46 designates a lower $SiO_2$ film disposed on the lower surface of each laser chip. Also, in this stacked laser device, first to fourth laser chips 1 to 4 are successively stacked on the heat sink 5 through the solder layers 43.

Figure 8:
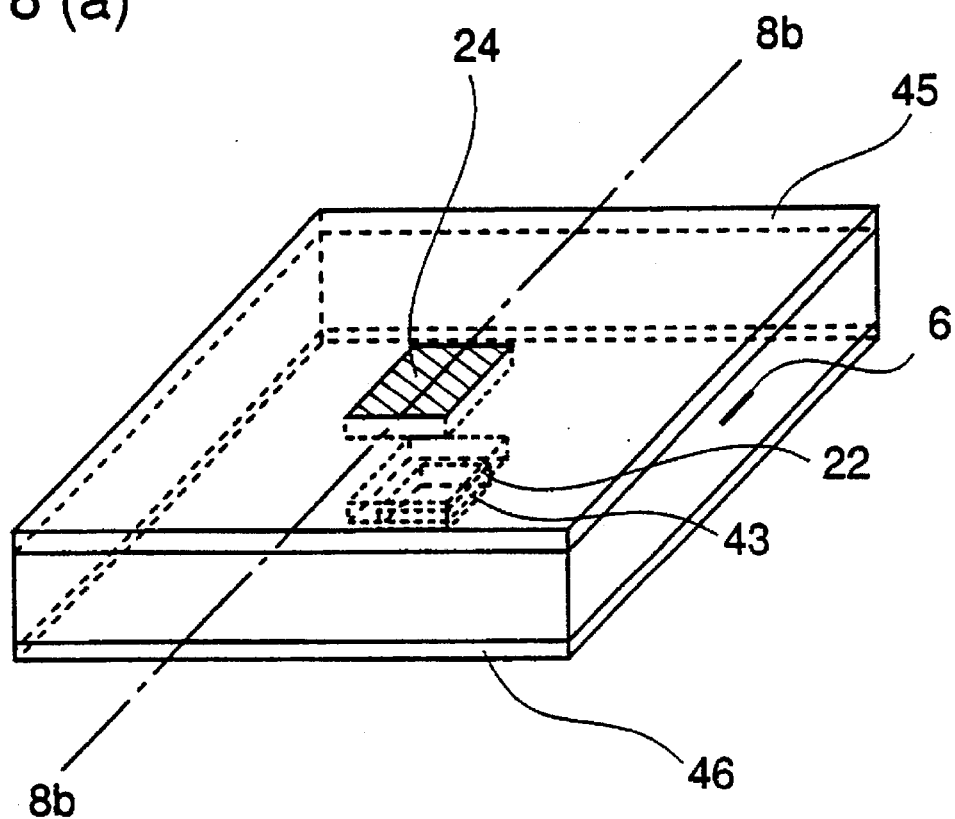
FIG. 8(a) is a perspective view of a unit semiconductor laser chip before assembling of the stacked semiconductor laser device according to the third embodiment of the present invention.
FIG. 8(b) is a cross-sectional view of the laser chip taken along a line a-a' in FIG. 8(a).
Figure 8:
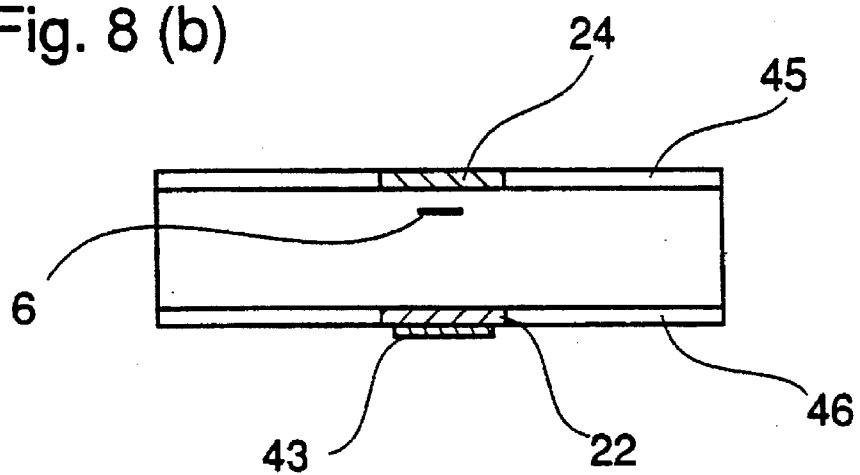

FIG. 8(a) is a perspective view illustrating a laser chip before assembly of a stacked laser device, and FIG. 8(b) is a cross-sectional view taken along a line 8b—8b in FIG. 8(a).

Initially, an upper electrode 24 is formed on the upper surface of each laser chip, and an upper $SiO_2$ film 45 having a thickness of 0.5–1.0 μm is deposited on the upper surface of the laser chip where the upper electrode 24 is absent. Further, a lower electrode 22 is formed on the lower surface of the laser chip, and a lower $SiO_2$ film 46 having a thickness of 0.5–1.0 μm is deposited on the lower surface of the laser chip where the lower electrode 22 is absent. These $SiO_2$ films 45 and 46 are deposited by vacuum evaporation. Thereafter, an AuSn solder layer 43 about 2 μm thick is formed on the surface of the lower electrode 22 by vacuum evaporation, completing the laser chip shown in FIGS. 8(a)–8(b).

The first laser chip 1 fabricated as described above is put on the heat sink 5 with the lower electrode 22 facing downward, and the first laser chip 1 is heated to a temperature of about 340° C. until the solder layer 43 is molten, whereby the solder layer 43 adheres the lower electrode 22 to the heat sink 5. Next, the second laser chip 2 is put on the first laser chip 1 so that the solder layer 43 of the second laser chip 2 is positioned on the upper electrode 24 of the first laser chip 1, followed by heating until the solder layer 43 is molten, whereby the solder layer 43 of the second laser chip 2 adheres the lower electrode 22 of the second laser chip 2 to the upper electrode 24 of the first laser chip 1. This process step is repeated with respect to the third laser chip 3 and the fourth laser chip 4. Finally, a wire 8 is bonded to the upper electrode 24 of the fourth laser chip 4 to complete the stacked laser device shown in FIG. 7.

In this third embodiment of the invention, since the adhesion of the AuSn solder 43 to the $SiO_2$ films 45 and 46 is poorer than the adhesion of the AuSn solder to the upper and lower electrodes 24 and 22, the solder 43 remains within the region between these electrodes and does not spread over the regions where the electrodes are absent. Therefore, unwanted flow of the solder toward the side surface of a laser chip is prevented, whereby short-circuiting between the upper electrode and the lower electrode of a laser chip is avoided.

Also in this third embodiment, the first to fourth laser chips are automatically aligned with each other by the surface tension of the molten solder between the upper electrode and the lower electrode of adjacent laser chips. As a result, a stacked laser device in which a plurality of laser chips are aligned with high precision is realized.

While in the above-described third embodiment $SiO_2$ films are employed, other insulating films, such as SiN films, may be employed with the same effects as described above.

The upper and lower $SiO_2$ films 45 and 46 according to this third embodiment may be applied to the electrode structure according to the first or second embodiment. More specifically, in the structure according to the first or second embodiment, when insulating films having poor adhesion to the solder 23, such as $SiO_2$ or SiN, are formed on the upper and lower surfaces of a laser chip surrounding the upper and lower electrodes, respectively, unwanted flow of the solder toward the side surface of the laser chip is effectively suppressed. As a result, short-circuiting between the upper electrode and the lower electrode of a laser chip is avoided.

Embodiment 4.

Figure 9:
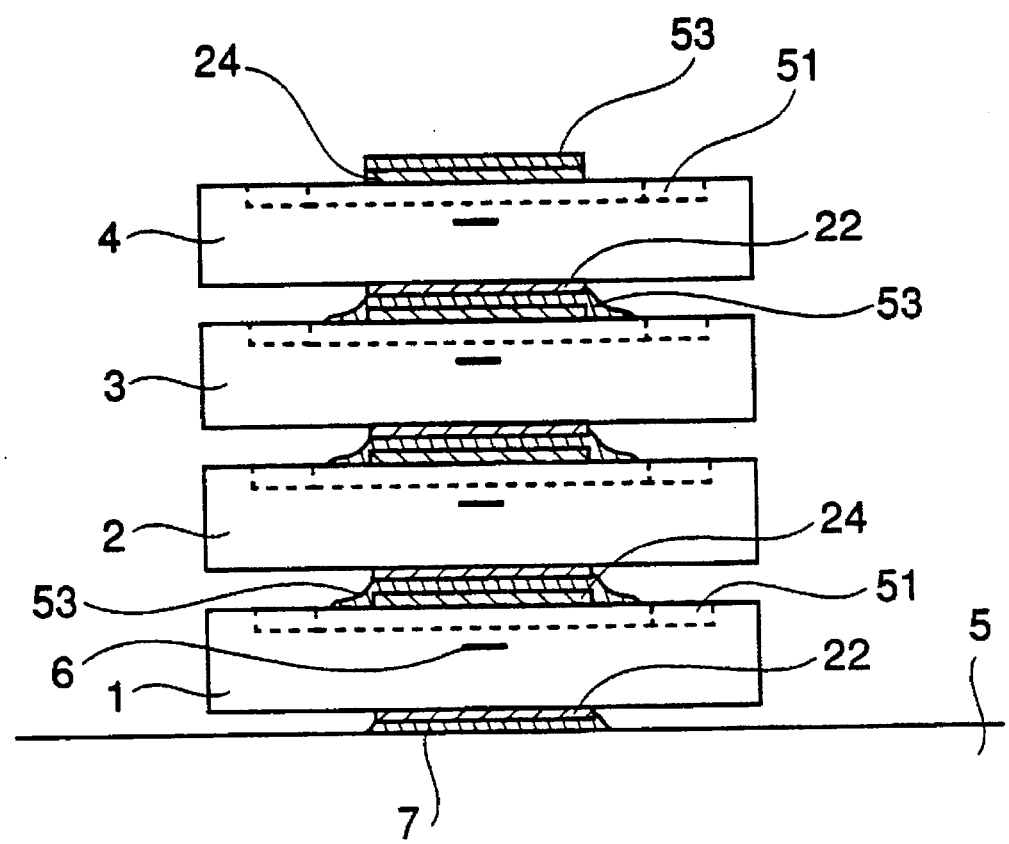
FIG. 9 is a front view of a stacked semiconductor laser device in accordance with a fourth embodiment of the present invention.

FIG. 9 is a front view of a stacked laser device according to a ninth embodiment of the present invention. In the figure, the same reference numerals as in FIG. 1 designate the same or corresponding parts. Reference numeral 51 designates a groove on the upper surface of each laser chip surrounding the upper electrode 24. Reference numeral 53 designates a solder layer, such as AuSn. Also in this fourth embodiment, first to fourth laser chips 1 to 4 are stacked on the heat sink 5 in this order, and the respective laser chips and the heat sink are adhered through the solder layers 53.

Figure 10:
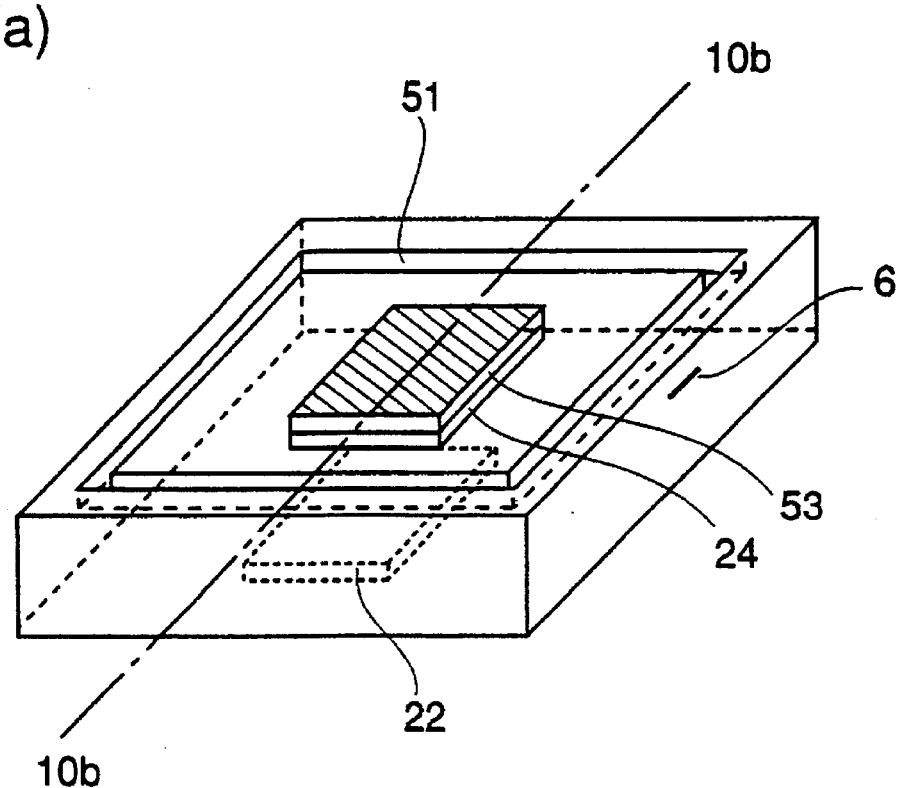
FIG. 10(a) is a perspective view of a unit semiconductor laser chip before assembly of the stacked semiconductor laser device according to the fourth embodiment of the present invention.
FIG. 10(b) is a cross-sectional view of the laser chip taken along a line 10b—10b in FIG. 10(a).
Figure 10:
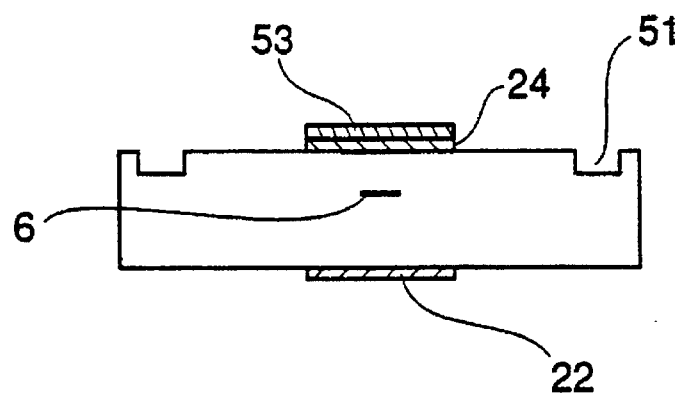

FIG. 10(a) is a perspective view illustrating a laser chip before assembly of the stacked laser device shown in FIG. 9, and FIG. 10(b) is a cross-sectional view taken along a line 10b—10b in FIG. 10(a).

A description is given of a method of fabricating the stacked laser device. Initially, an upper electrode 24 is formed on the upper surface of the laser chip. Preferably, the upper electrode is about 100 μm both in length and width, and the laser chip is about 300 μm both in length and width and about 100 μm in thickness. Then, the groove 51 is formed on the upper surface of the laser chip surrounding the upper electrode 24, preferably by etching. The groove 51 is about 250 μm along each edge, about 10 μm in width, and about 5 μm in depth. Further, a lower electrode 22 is formed on the lower surface of the laser chip. Thereafter, an AuSn solder layer 53 about 2 μm thick is formed on the surface of the upper electrode 24 by vacuum evaporation.

Thereafter, the laser chips fabricated as described above are stacked in the same manner as described for the second embodiment of the invention. That is, solder 7 is applied to the surface of the heat sink 5, and the first laser chip is put on the heat sink 5 so that the lower electrode of the first laser chip is positioned on the solder 7. Then, the first laser chip is heated to a temperature of about 340° C. until the solder 7 is molten, whereby the solder 7 adheres the lower electrode 22 of the first laser chip to the heat sink 5. Next, the second laser chip 2 is put on the first laser chip 1 so that the solder layer 53 of the second laser chip 2 is positioned on the upper electrode 24 of the first laser chip 1, followed by heating until the solder layer 53 is molten, whereby the solder layer 53 adheres the lower electrode 22 of the second laser chip 2 to the upper electrode 24 of the first laser chip 1. This process step is repeated with respect to the third and fourth laser chips 3 and 4, resulting in the stacked laser structure shown in FIG. 9. Finally, a wire (not shown) is bonded to the upper electrode 24 of the fourth laser chip to complete a stacked laser device.

In this fourth embodiment of the invention, since the upper electrode 24 is surrounded by the groove 51, even when the solder flows over the edges of the electrode, it is collected in the groove 51 and does not spread outside the groove 51. Therefore, unwanted flow of the solder over the side surface of the laser chip is prevented, whereby short-circuiting between the upper electrode and the lower electrode of the laser chip is avoided.

Also in this fourth embodiment of the invention, the first to fourth laser chips are automatically aligned with each other by the surface tension of the molten solder between the upper electrode and the lower electrode of the adjacent laser chips. That is, a stacked laser device in which a plurality of laser chips are aligned with high precision is realized.

The groove 51 employed in this fourth embodiment may be combined with the electrode structure according to the first or second embodiment of the invention. More specifically, in the structure according to the first or second embodiment, when a groove as in this fourth embodiment is formed around the upper electrode, the unwanted flow of the solder toward the side surface of a laser chip is effectively prevented. Likewise, when a groove according to this fourth embodiment is formed around the upper electrode and an insulating film having a poor adhesion to the solder, such as $SiO_2$ or SiN, is formed on the upper surface of the laser chip where the groove and the upper electrode are absent, the unwanted flow of the solder toward the side surface of the laser chip is prevented with greater effect. Furthermore, the electrode structure according to the first or second embodiment, the insulating film according to the third embodiment, and the groove according to the fourth embodiment may be combined. In this case, the effect of preventing the unwanted flow of the solder toward the side surface of a laser chip is significantly increased, whereby short-circuiting between the upper electrode and the lower electrode of a laser chip is avoided.

Embodiment 5.

Figure 11:
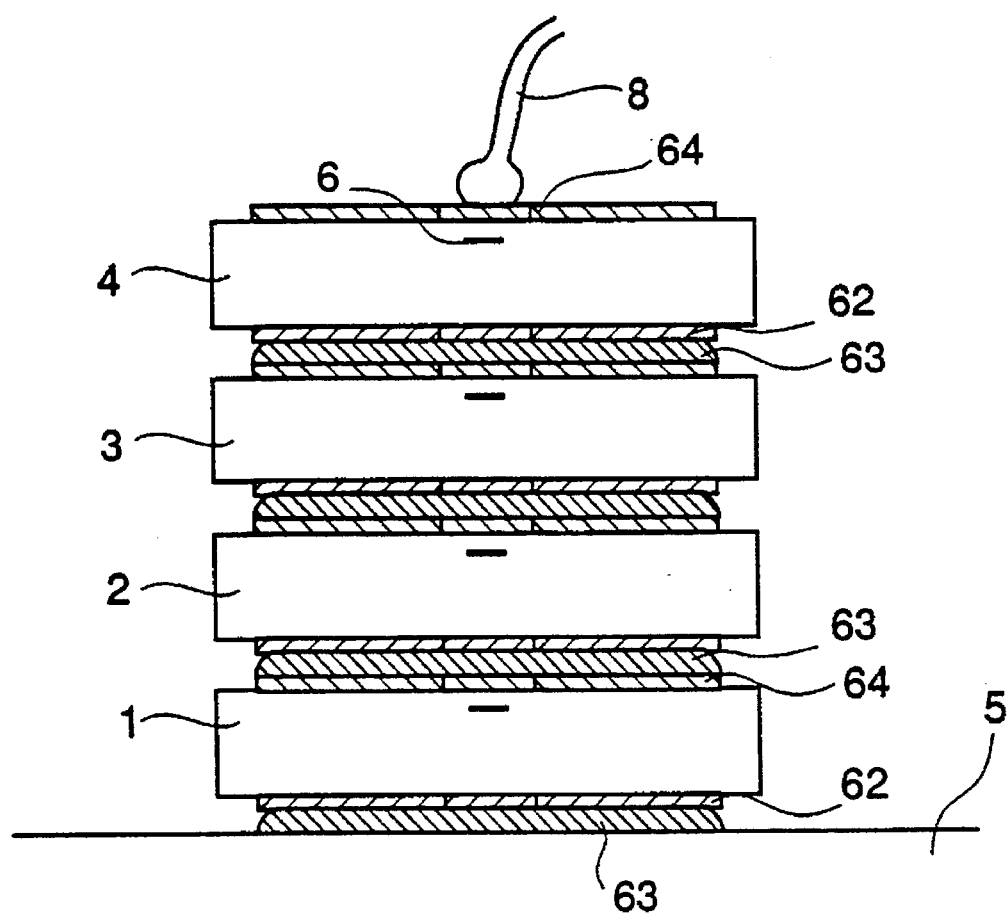
FIG. 11 is a front view of a stacked semiconductor laser device in accordance with a fifth embodiment of the present invention.
Figure 12:
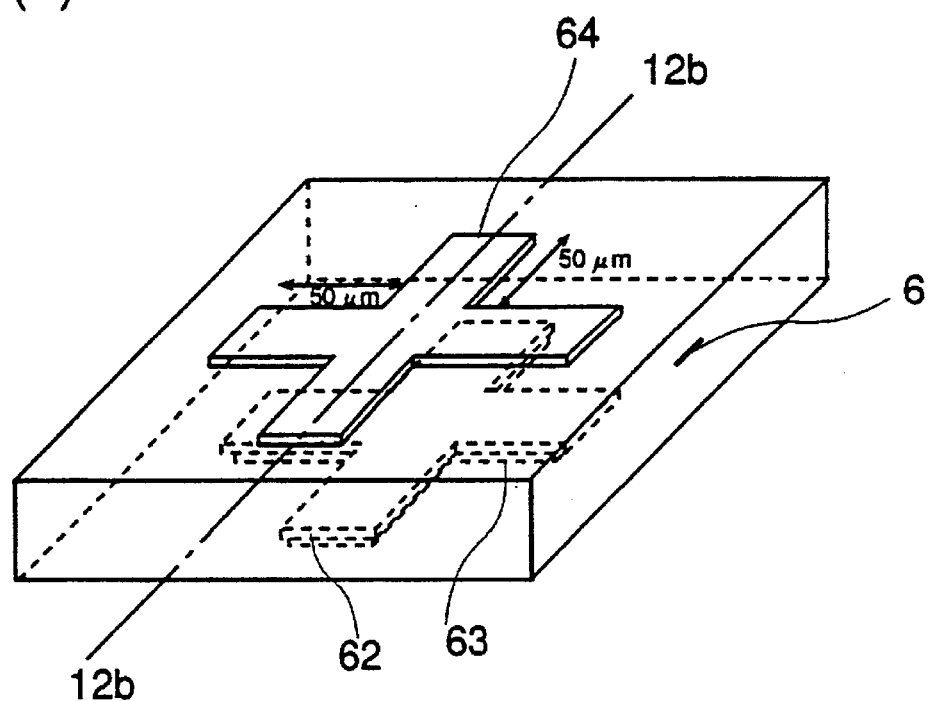
FIG. 12(a) is a perspective view of a unit semiconductor laser chip before assembly of the stacked semiconductor laser device according to the fifth embodiment of the invention.
FIG. 12(b) is a cross-sectional view of the laser chip taken along a line 12b—12b in FIG. 12(a).
Figure 12:
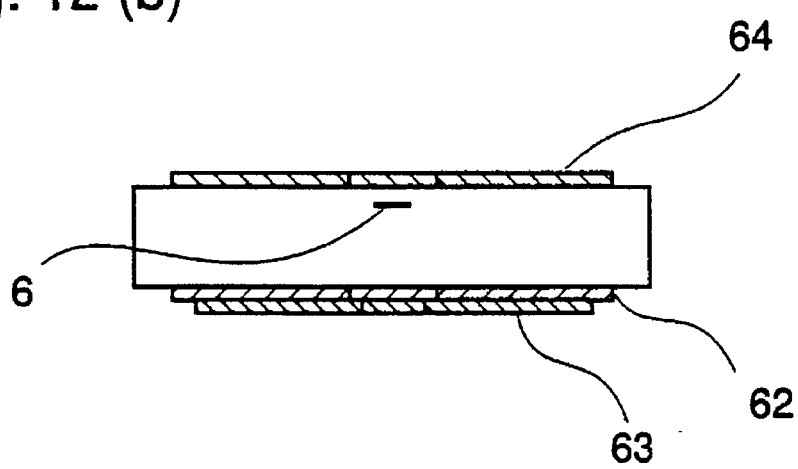

FIG. 11 is a front view of a stacked laser device according to a fifth embodiment of the present invention. FIG. 12(a) is a perspective view illustrating a laser chip before assembly of the stacked laser device, and FIG. 12(b) is a cross-sectional view taken along a line 12b—12b in FIG. 12(a). In these figures, the same reference numerals as in FIGS. 1 and 2(a)–2(c) designate the same or corresponding parts. Reference numeral 62 designates a cross-shaped lower electrode, numeral 64 designates a cross-shaped upper electrode, and numeral 63 designates an AuSn solder layer. As shown in FIG. 11, first to fourth laser chips 1 to 4 are stacked on the heat sink 5 in this order, and the respective laser chips and the heat sink are adhered through the solder layers 63.

A description is given of the fabricating method.

Initially, the cross-shaped upper electrode 64 that is about 50 μm along each edge is formed on the upper surface of the laser chip that is about 300 μm both in length and width and about 100 μm in thickness. The cross-shaped lower electrode 62 is as large as the upper electrode 64 on the lower surface of the laser chip. Thereafter, an AuSn solder layer 63 about 2 μm thick is formed on the surface of the lower electrode 62 by vacuum evaporation, whereby the laser chip shown in FIGS. 2(a)–2(b) is completed.

Thereafter, the laser chips fabricated as described above are stacked in the same manner as described in the first embodiment of the invention. That is, the first laser chip 1 is put on a heat sink 5 with the lower electrode facing down and heated to about 340° C. until the solder layer 63 is molten, whereby the solder layer 63 adheres the lower electrode 62 to the heat sink 5. Next, the second laser chip 2 is put on the first laser chip 1 so that the solder layer 63 of the second laser chip 2 is positioned on the upper electrode 64 of the first laser chip 1, followed by heating until the solder layer 63 of the second laser chip 2 is molten, whereby the solder layer 63 adheres the lower electrode 62 of the second laser chip 2 to the upper electrode 64 of the first laser chip 1. This process step is repeated with respect to third and fourth laser chips. Finally, a wire 8 is bonded to the upper electrode 64 of the fourth laser chip 4 to complete the stacked laser device shown in FIG. 11.

Figure 13:
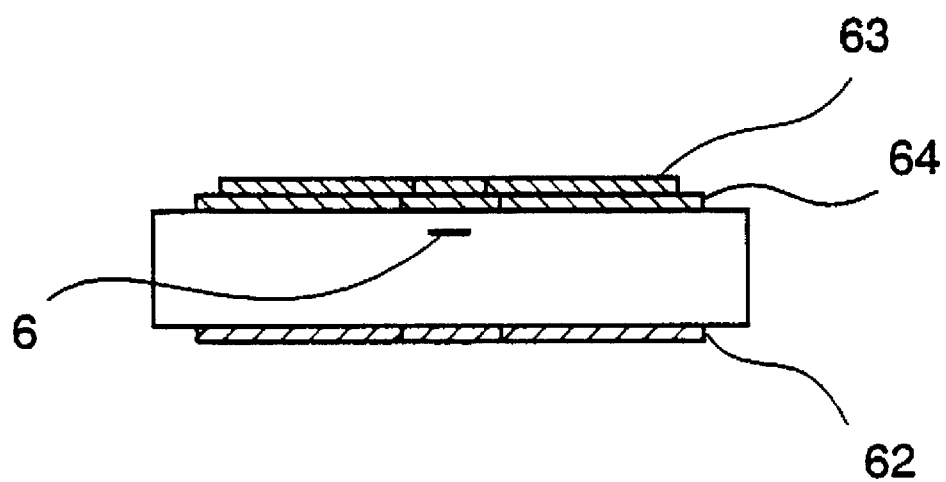
FIG. 13 is a cross-sectional view of a unit semiconductor laser chip with a solder layer on its upper electrode, before assembly of the stacked semiconductor laser device according to the fifth embodiment of the invention.
Figure 14:
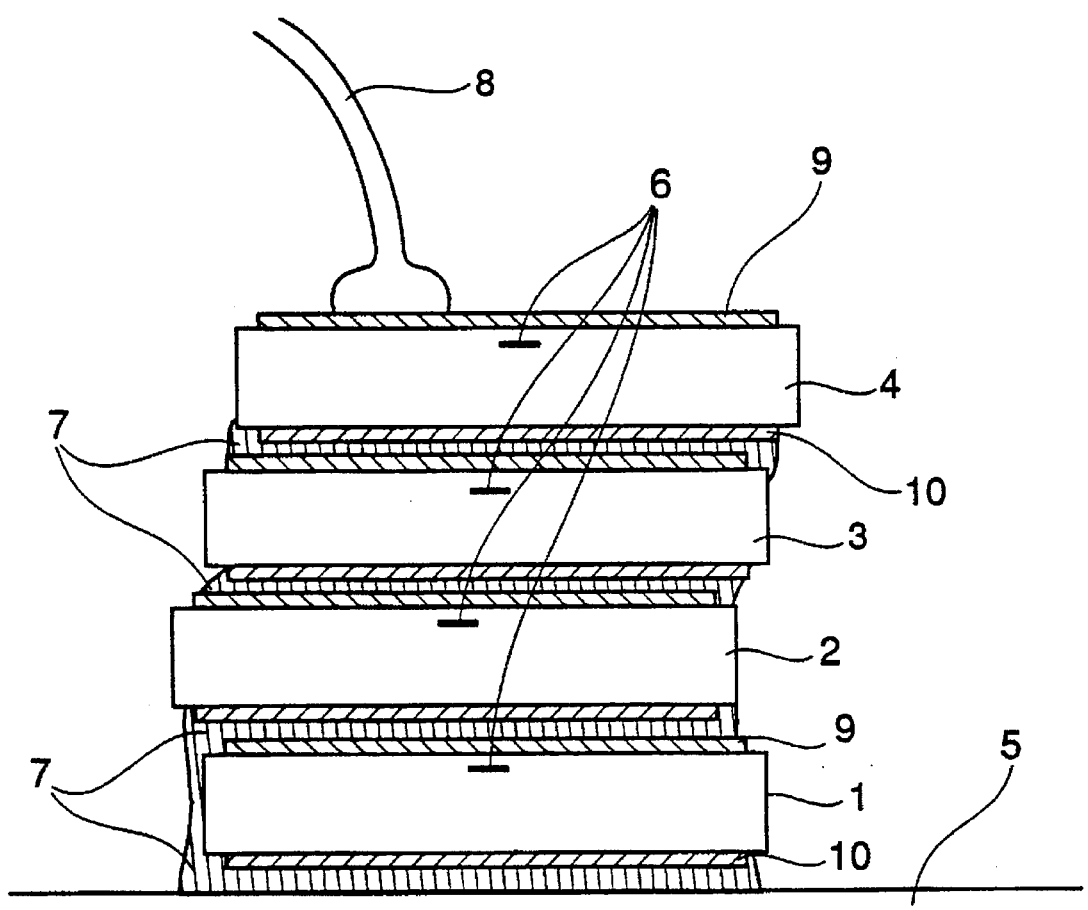
FIG. 14 is a front view of a stacked semiconductor laser device according to the prior art.

FIG. 13 is a cross-sectional view of a laser chip before assembly of a stacked laser device according to a modification of the fifth embodiment of the invention. In the laser chip shown in FIG. 13, the solder layer 63 is formed on the upper electrode 64 whereas it is formed on the lower electrode 62 in the laser chip according to the fifth embodiment. Also in this case, a stacked laser device having the same structure as shown in FIG. 11 is realized. The process steps of assembling the stacked laser device using the laser chip shown in FIG. 13 are fundamentally identical to those already described for the fifth embodiment except that the first laser chip 1 is adhered to the heat sink 5 through solder that is applied to the heat sink in advance, followed by heating to melt the solder.

In the fifth embodiment and the modification, since the upper electrode 64 (lower electrode 62) is disposed on a part of the upper surface (lower surface) of the laser chip, in other words, it is not disposed over the entire upper surface (lower surface) of the laser chip, there is little possibility of the solder overflowing the upper electrode (lower electrode) region and reaching the edges of the upper surface (lower surface). Therefore, the solder hardly reaches the side surface of the laser chip, so that unwanted short-circuiting between the upper electrode and the lower electrode of the laser chip is avoided.

Also in this fifth embodiment of the invention, center positions of the first to fourth laser chips are automatically aligned by the surface tension of the molten solder that is present between the electrodes of the adjacent laser chips. In addition, since the upper and lower electrodes are cross-shaped, the surface tension of the molten solder acts in a direction of rotation of the laser chips, so that the directions of the laser chips are automatically aligned. As a result, a stacked laser device that provides high accuracy in aligning the center positions and directions of the laser chips is realized.

The cross-shaped electrode structure according to this fifth embodiment may be combined with the electrode structure according to the first or second embodiment, the insulating film according to the third embodiment, and the groove according to the fourth embodiment. Thereby, unwanted flow of the solder toward the side surface of the laser chip is further suppressed, and short-circuiting between the upper electrode and the lower electrode of a laser chip is avoided. In addition, the center positions and the directions of the laser chips are automatically aligned.

What is claimed is:

1. A semiconductor laser device comprising a stack of semiconductor laser chips, each semiconductor laser chip including opposite upper and lower surfaces, an upper electrode disposed on a portion of the upper surface, and a lower electrode disposed on a portion of the lower surface, wherein each of the semiconductor laser chips has a recess in its lower surface, each lower electrode is disposed in the recess of the corresponding semiconductor laser chip, and two adjacent semiconductor laser chips in the stack are connected such that the lower electrode of an upper laser chip is bonded to the upper electrode of a lower laser chip with solder.

2. A method of fabricating a semiconductor laser device comprising:

preparing a plurality of semiconductor laser chips, including first and second semiconductor laser chips, each semi-conductor laser chip having opposite upper and lower surfaces, and a heat sink having a surface;

forming an upper electrode on a portion of the upper surface of each semiconductor laser chip;

forming a recess in a portion of the lower surface of each semiconductor laser chip by etching;

forming a lower electrode in the recess of each semiconductor laser chip;

forming a solder layer on the lower electrode of each semiconductor laser chip;

mounting the first semiconductor laser chip on the surface of the heat sink with the lower electrode facing the heat sink and heating the first semiconductor laser chip to adhere the first semiconductor laser chip to the heat sink with the solder layer; and mounting the second semiconductor laser chip on the upper surface of the first semiconductor laser chip with the lower electrode of the second semiconductor laser chip facing the first semiconductor laser chip, followed by heating to adhere the second semiconductor laser chip to the first semiconductor laser chip with the solder layer and repeating the mounting and the heating with respect to remaining semiconductor laser chips, thereby completing a semiconductor laser device comprising a stack of the semiconductor laser chips.

3. A method of fabricating a semiconductor laser device comprising:

preparing a plurality of semiconductor laser chips, including first and second semiconductor laser chips, each semiconductor laser chip having opposite upper and lower surfaces, and a heat sink having a surface;

forming an upper electrode on a portion of the upper surface of each semiconductor laser chip;

forming a recess in a portion of the lower surface of each semiconductor laser chip by etching;

forming a lower electrode in the recess of each semiconductor laser chip;

forming a solder layer on the upper electrode of each semiconductor laser chip;

applying solder to the surface of the heat sink;

mounting the first semiconductor laser chip on the surface of the heat sink with the lower electrode of the first semiconductor laser chip contacting the solder on the heat sink and heating the first semiconductor laser chip to adhere the first semiconductor laser chip to the heat sink with the solder; and mounting the second semiconductor laser chip on the upper surface of the first semiconductor laser chip with the lower electrode of the second semiconductor laser chip contacting the solder layer on the first semiconductor laser chip, followed by heating to adhere the second semiconductor laser chip to the first semiconductor laser chip with the solder layer and repeating the mounting and the heating with respect to remaining semiconductor laser chips, thereby completing a semiconductor laser device comprising a stack of the semiconductor laser chips.

* * * * *